(12) United States Patent
Gao et al.

(10) Patent No.: US 10,877,082 B2
(45) Date of Patent: Dec. 29, 2020

(54) CONVERTER VALVE FAULT WARNING METHOD AND SYSTEM

(71) Applicants: NR ELECTRIC CO., LTD, Jiangsu (CN); NR ENGINEERING CO., LTD, Jiangsu (CN)

(72) Inventors: Shengfu Gao, Jiangsu (CN); Taixun Fang, Jiangsu (CN); Yongping Wang, Jiangsu (CN); Xiang Zhang, Jiangsu (CN); Weiming Pan, Jiangsu (CN); Ming Yuan, Jiangsu (CN); Guqing Zhou, Jiangsu (CN)

(73) Assignees: NR ELECTRIC CO., LTD, Jiangsu (CN); NR ENGINEERING CO., LTD, Jiangsu (CN)

( * ) Notice: Subject to any disclaimer, the term of this patent is extended or adjusted under 35 U.S.C. 154(b) by 380 days.

(21) Appl. No.: 15/739,750

(22) PCT Filed: Mar. 1, 2017

(86) PCT No.: PCT/CN2017/075367
§ 371 (c)(1),
(2) Date: Dec. 24, 2017

(87) PCT Pub. No.: WO2017/148396
PCT Pub. Date: Sep. 8, 2017

(65) Prior Publication Data
US 2018/0196099 A1    Jul. 12, 2018

(30) Foreign Application Priority Data

Mar. 3, 2016  (CN) .......................... 2016 1 0123470

(51) Int. Cl.
*G01R 31/08* (2020.01)
*H02M 7/757* (2006.01)
(Continued)

(52) U.S. Cl.
CPC ............... *G01R 31/08* (2013.01); *H02J 13/00* (2013.01); *H02M 1/32* (2013.01); *H02M 7/7575* (2013.01);
(Continued)

(58) Field of Classification Search
CPC ....................................................... G01R 31/08
(Continued)

(56) References Cited

U.S. PATENT DOCUMENTS 3,728,557 A * 4/1973 Pelly .................... H03K 17/725
327/28
4,079,403 A * 3/1978 Temple ............... H01L 29/0661
257/170
(Continued)

FOREIGN PATENT DOCUMENTS

| CN | 101964543 A | 2/2011 |
| CN | 101964544 A | 2/2011 |

(Continued)

*Primary Examiner* — Ricky Ngon
(74) *Attorney, Agent, or Firm* — Winston Hsu

(57) ABSTRACT

Within a predetermined time range, record time information of status indication signals fed back by thyristor control units (TCU) of a converter valve. Perform statistics and comparison of the pieces of time information using a bias statistics method. Mark a thyristor level whose bias exceeds a preset value. And determine a probability of failure in the thyristor according to the marking result.

13 Claims, 4 Drawing Sheets

(51) Int. Cl.
*H02M 1/32* (2007.01)
*H02J 13/00* (2006.01)
*H02M 1/088* (2006.01)

(52) U.S. Cl.
CPC .............. *H02M 1/088* (2013.01); *Y02E 60/00* (2013.01); *Y04S 10/20* (2013.01)

(58) Field of Classification Search
USPC ......................................................... 702/179
See application file for complete search history.

(56) References Cited

U.S. PATENT DOCUMENTS

| | | | | |
|---|---|---|---|---|
| 5,521,526 A | * | 5/1996 | Nyberg | G01R 31/263 |
| | | | | 324/762.01 |
| 6,205,039 B1 | * | 3/2001 | Åström | G01R 31/40 |
| | | | | 363/50 |
| 2012/0194957 A1 | * | 8/2012 | Wei | H02M 1/32 |
| | | | | 361/91.8 |
| 2015/0089291 A1 | * | 3/2015 | Nishikido | G06F 11/0772 |
| | | | | 714/33 |

FOREIGN PATENT DOCUMENTS

| | | | | |
|---|---|---|---|---|
| CN | 104764991 A | 7/2015 | | |
| CN | 105243281 A | 1/2016 | | |
| CN | 105703481 A | 6/2016 | | |
| WO | WO-2015074620 A1 | * 5/2015 | .............. | H02M 1/32 |

* cited by examiner

CONVERTER VALVE FAULT WARNING METHOD AND SYSTEM

BACKGROUND OF THE INVENTION

1. Field of the Invention

The present invention relates to the field of high-power electronics, and more particularly to an early warning method and system for a failure in a converter valve.

2. Description of the Prior Art

High-voltage direct current (HVDC) power transmission is the most important, most traditional, and most rapidly developing one among applications of power electronics technology. The working performance of a converter valve, as a primary core device in HVDC power transmission projects, directly determines the operation stability of direct current power transmission. A converter valve control system is used to implement the control of the converter valve under various operating conditions. The converter valve control system consists essentially of a direct current control protection system, a converter valve control unit (VCU), and a thyristor control unit (TCU). The converter VCU serves as a bridge between the direct current control protection system and the converter valve, and mainly functions to receive control signals sent by the direct current control protection system, and generate a trigger pulse according to the control signals and using a logic algorithm and send the trigger pulse to the converter valve. The converter VCU also receives status indication signals of thyristor levels returned by the converter valve, and processes the status indication signals and provides feedbacks to the direct current control protection system, so as to monitor an operation status of the converter valve. In addition, operation statuses of the thyristor levels and an operation status of the converter VCU are submitted to a monitoring system over an Ethernet.

The converter valve is a complex system including multiple thyristor levels consisting of thyristors and resistance-capacitance circuits of the thyristors, a reactor, and a cooling device. After a long time of operation, a failure may occur due to performance degradation. In addition, there are slight differences in voltage-balancing consistency of the thyristor levels due to slight differences in parameters of the resistance-capacitance circuits. Under a long-time high-voltage operation condition, the service life of some thyristor levels may be shortened, and in a severe case, the risk of outage of the direct current system is caused by failures of several thyristor levels, which adversely affects safe and stable operation of the direct current system. In the operation of existing direct current projects, a method for monitoring operation statuses of all thyristor levels of the converter valve only consists in roughly monitoring whether there is a status feedback signal, so that differences between different thyristor levels are usually ignored. If in the converter VCU, a thyristor level with relatively poor performance can be identified based on performance differences between different thyristor levels of the converter valve and using statistical analysis of data and an early warning is provided, the risk of outage of the direct current system caused by failures of thyristor levels can be reduced, which represents an effective auxiliary means for safe and reliable operation of the direct current system.

SUMMARY OF THE INVENTION

An objective of the present invention is to provide an early warning method and system for a failure in a converter valve, which can identify a thyristor level with a relatively high probability of failure, achieve early warning, and provide a reference for device replacement, thereby reducing a probability of outage of a direct current system due to a failure of a thyristor level, and providing references for device performance optimization and circuit design optimization of a converter valve.

To achieve the foregoing objective, the solutions of the present invention are as follows:

An early warning method for a failure in a converter valve, comprising: within a predetermined time range, recording time information of status indication signals fed back by thyristor control units (TCU) of a converter valve, performing statistics and comparison of the pieces of time information using a bias statistics method, marking a thyristor level whose bias exceeds a preset value, and determining a probability of failure in the thyristor according to the marking result.

The bias statistics method involves: finding a time of earliest arrival and a time of latest arrival from the time information of the status indication signals fed back by the TCUs of the converter valve, calculating a time difference between the earliest arrival and the latest arrival, and comparing the time difference with a predetermined duration, wherein if the time difference is less than the predetermined duration, it is determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the predetermined duration are selected and accumulated in memories of respective thyristor levels.

The bias statistics method involves: if the time information of the status indication signals fed back by the TCUs of the converter valve satisfies a normal distribution, setting an expected deviation parameter and a standard deviation parameter so as to determine a normal distribution interval, and comparing the pieces of time information with the normal distribution interval, wherein if the time information of the status indication signals fed back by the TCUs of the converter valve is all comprised in the normal distribution interval range, it is determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the normal distribution interval are selected and accumulated in memories of respective thyristor levels.

The bias statistics method involves: calculating an average value of the time information of the status indication signals fed back by the TCUs of the converter valve, presetting a time range parameter so as to determine an average distribution interval range with the average value as the center and the time range parameter as positive and negative boundary conditions, and comparing the pieces of time information with the interval range, wherein if the time information of the status indication signals fed back by the TCUs of the converter valve is all comprised in the average distribution interval range, it is determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the average distribution interval are selected and accumulated in memories of respective thyristor levels.

The early warning method further comprises: recording a time point when the status indication signals having a positive bias characteristic or a negative bias characteristic occur, so as to obtain a statistical distribution of performance biases of thyristor levels with time.

The early warning method further comprises: reading an accumulated value within the predetermined time range as a data statistics result, wherein all data is used for comparison and analysis of performance differences between the thyristor levels of the converter valve; and selecting, according to the data statistics result, a thyristor level whose accumulated bias number exceeds a set threshold, determining a specific position of the thyristor level in the converter valve, and predicting a probability of a problem in the thyristor level according to the data statistics result.

The early warning method further comprises: storing, according to the predetermined duration, accumulated values of the positive biases and the negative biases corresponding to the thyristor levels and time information corresponding to the occurrence of a bias in a storage device having a long-term data storage function.

The status indication signals fed back by the TCUs represent status indication signals which are acquired by a converter valve control unit (VCU) and are fed back by the respective TCUs corresponding to the thyristor levels of the converter valve, the status indication signal being a status indication signal meaning that a thyristor level has established a forward voltage and meet a trigger condition;

the TCU presets a voltage threshold, wherein the setting of the threshold satisfies a minimum energy requirement with which the TCU can trigger a thyristor to be reliably turned on; and if detecting that a voltage across a thyristor exceeds the voltage threshold, the TCU generates a status indication signal and sends the same to the converter VCU.

An early warning system for a failure in a converter valve, comprising:

a register array configured in a converter valve control unit (VCU) and used to store bias data of thyristor levels of a converter valve; and a high-speed processor configured in the converter VCU and used to process, using a bias statistics method, status indication signals fed back by thyristor control units (TCUs).

The early warning system further comprises:

an interface configured in the converter VCU and used to provide on-line monitoring of bias data or read the data.

According to the foregoing solution, a converter VCU performs statistics and selection of status indication signals fed back by TCUs of a converter valve, and therefore, the present invention can achieve bias analysis on performance differences between thyristor levels of the converter valve, identify a thyristor level with relatively poor performance, and perform early warning, thereby reducing the risk of outage of a direct current system caused by failures of thyristor levels, and improving safe and reliable operation of the direct current system.

The present invention provides an effective auxiliary means for daily operation and maintenance as well as design optimization of a converter valve. A bias statistics result is used as an auxiliary reference for predicting performance degradation of a thyristor level, and a thyristor level with a relatively poor voltage-balancing characteristic is selected, so that the risk of failure in a thyristor level can be effectively predicted, thereby reducing a probability of outage of a direct current system due to a failure of a thyristor level. In addition, a research and design institute of a converter valve can analyze the cause for a thyristor level with a relatively large bias of voltage-balancing consistency and perform optimization and improvement accordingly.

These and other objectives of the present invention will no doubt become obvious to those of ordinary skill in the art after reading the following detailed description of the preferred embodiment that is illustrated in the various figures and drawings.

DETAILED DESCRIPTION

The technical solution of the present invention is described in detail below with reference to the accompanying drawings.

Figure 1:
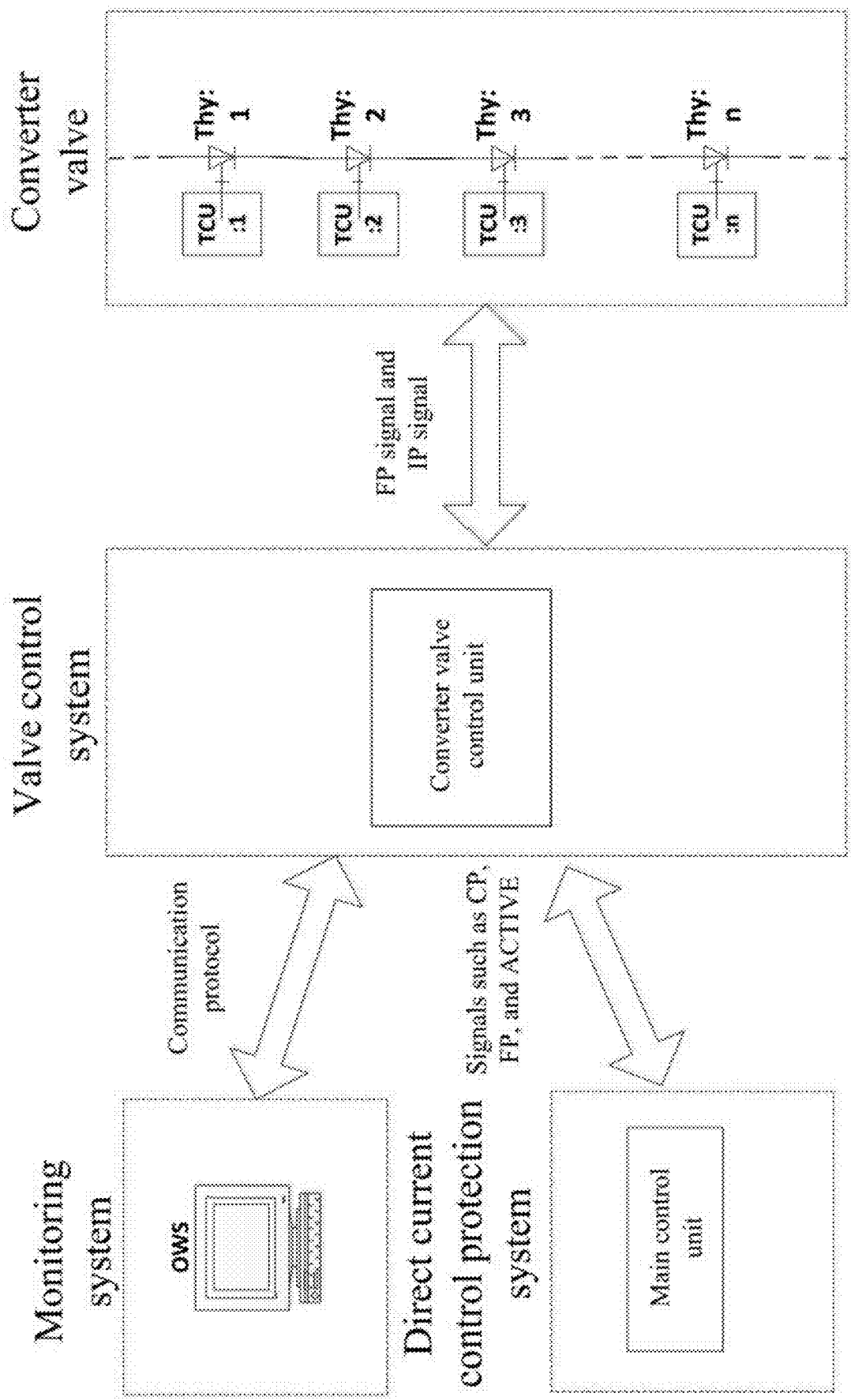
FIG. 1 is a schematic structural diagram of a converter valve control system according to the present invention.

The present invention provides an early warning system for a failure in a converter valve. The system is implemented based on a converter VCU. The converter VCU is a critical core device of an entire converter valve control system. A schematic structural diagram of the converter valve control system is provided in FIG. 1. The converter valve control system implements the control of a converter valve under various operating conditions. The converter valve control system consists essentially of a direct current control protection system, a converter VCU, and a TCU. The converter VCU serves as a bridge between the direct current control protection system and the converter valve, and mainly functions to receive control signals sent by the direct current control protection system, and generate a trigger pulse according to the control signals and using a logic algorithm and send the trigger pulse to the converter valve. The converter VCU also receives status indication signals of thyristor levels returned by the converter valve, and processes the status indication signals and provides feedbacks to the direct current control protection system, so as to monitor an operation status of the converter valve. In addition, operation statuses of the thyristor levels and an operation status of the converter VCU are submitted to a monitoring system over an Ethernet.

In the early warning system for a failure in a converter valve provided in the present invention, a register array used to store bias data needs to be configured for thyristor levels of the converter valve in the converter VCU, and a storage area used to store bias data with timestamp information is configured. A high-speed processor configured in the converter VCU is a critical core device, and is mainly used to acquire and process a high speed signal and implement a preset logic function. The high-speed processor is capable of acquiring and processing a pulse signal on at least a microsecond level. A bias statistics method is designed in the converter VCU and is used to select those having a relatively large bias from status indication signals fed back by TCUs of the converter valve, and classify and store the selected status indication signals. An interface for providing and reading bias data is designed in the converter VCU, and is used to on-line monitor bias data or read the data for off-line analysis. A thyristor level with a large accumulated bias number is found according to a data statistics result, and a specific position of the thyristor level in the converter valve is determined. In this way, a probability of a problem in such thyristor levels can be predicted, and a reference for device replacement and design optimization is provided.

The present invention also provides an early warning method for a failure in a converter valve. A specific implementation process of the method is as follows:

(1) A register array used to store bias data is configured for thyristor levels of a converter valve in a converter VCU. The register array is a data storage area composed of registers that correspond to the thyristor levels one by one.

(2) A high-speed processor is configured in the converter VCU, is capable of acquiring and processing a pulse signal on at least a microsecond level, and is used to perform simultaneous acquisition of status indication signals fed back by TCUs which are in the order of not less than hundreds and perform high-speed real-time processing.

Figure 2:
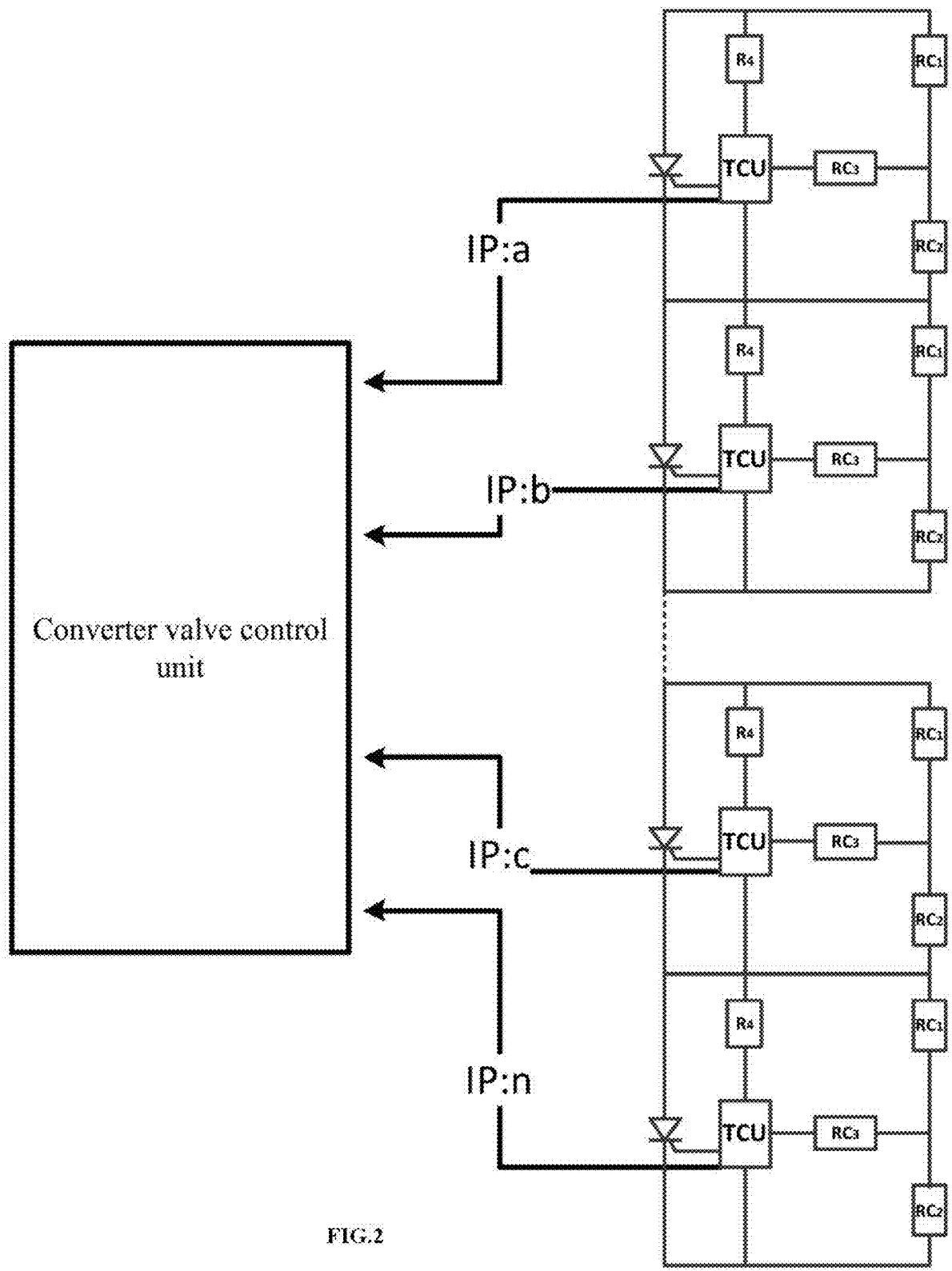
FIG. 2 is a schematic diagram of a converter VCU acquiring status indication signals fed back by TCUs according to the present invention.
Figure 3:
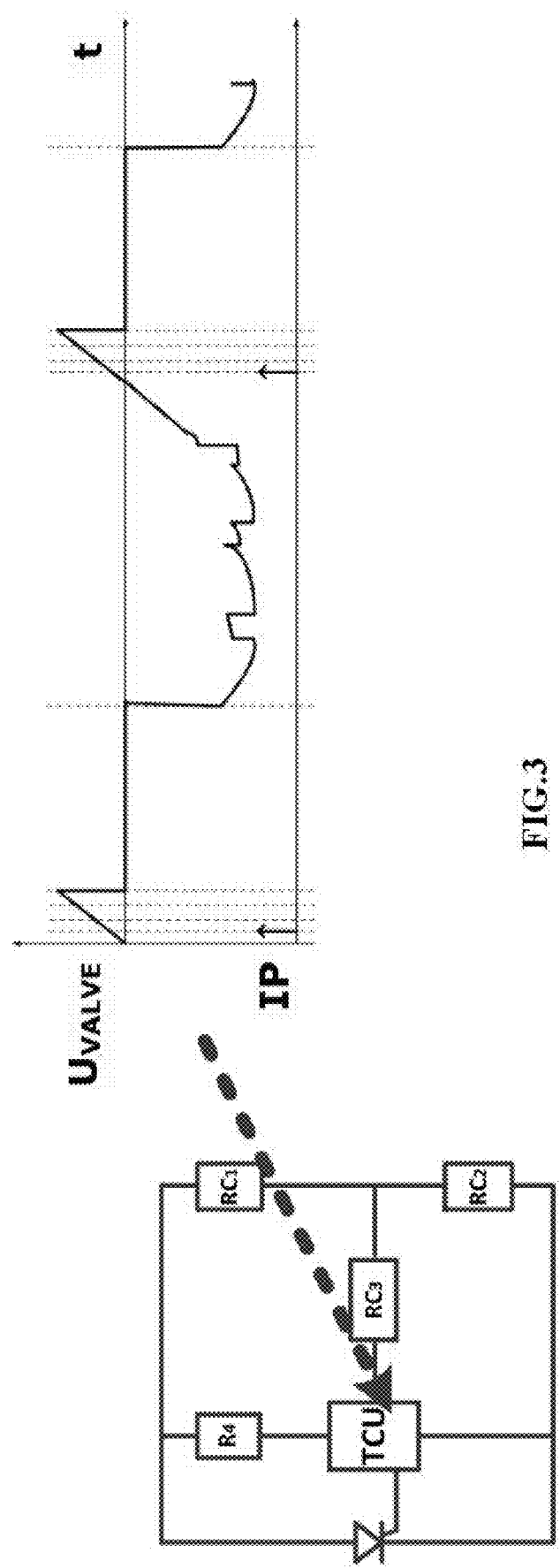
FIG. 3 is a diagram showing a circuit structure of a thyristor level and a principle of generation for a status indication signal according to the present invention.

(3) The converter VCU acquires a status indication signal fed back by a TCU corresponding to each thyristor level of the converter valve. FIG. 2 is a schematic diagram of the converter VCU acquiring the status indication signals fed back by the TCUs. In the figure, IP:a, IP:b, IP:c, and IP:n represent status indication signals fed back by different TCUs. The status indication signals fed back by the TCUs represent status indication signals which are acquired by a converter valve control unit (VCU) and are fed back by the respective TCUs corresponding to the thyristor levels of the converter valve, the status indication signal being a status indication signal (indication pulse, IP) meaning that a thyristor level has established a forward voltage and meet a trigger condition. A TCU presets a voltage threshold. The setting of the threshold satisfies a minimum energy requirement with which the TCU can trigger a thyristor to be reliably turned on. If detecting that a voltage across a thyristor exceeds the voltage threshold, the TCU generates a status indication signal and sending the same to the converter VCU. The converter VCU records a receiving time of the status indication signal for bias analysis. Normally, status indication signals fed back by thyristor levels on a same single valve have a very small time bias. However, under the influence of slight differences between device parameters of resistance-capacitance circuits, voltage-balancing consistency between thyristor levels are also slightly different. As a result, the status indication signals fed back by TCUs may have a larger time bias. FIG. 3 is a diagram showing a circuit structure of a thyristor level and a principle of generation for a status indication signal. In the figure, Uvalve represents a thyristor voltage, and IP represents a status indication signal.

(4) The converter VCU performs bias screening on the acquired status indication signals fed back by TCUs, stores a bias screening result in the register array for accumulation, and also adds a timestamp to bias data and stores the bias data in a set storage area.

The bias screening in the foregoing method (4) uses a bias statistics method. A method 1 may be used. In the method, the status indication signals fed back by the TCUs of the converter valve are arranged chronologically, a time of earliest arrival and a time of latest arrival are found, a time difference between the earliest arrival and the latest arrival is calculated, and the time difference is compared with a predetermined duration, wherein if the time difference is less than the predetermined duration, it can be determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the predetermined duration are selected and accumulated in memories of respective thyristor levels.

As discussed in the method 1, it is assumed that a number of thyristors included in one converter valve is N (N≥1). $A_1$, $A_2$, ..., and $A_N$ represent thyristors on N levels. The converter VCU detects a time of each of the status indication signals fed back by TCUs corresponding to the thyristor levels. A time of a status indication signal fed back by a TCU corresponding to a first detected thyristor $A_x$ (1≤X≤N) is $T_1$, and a time of a status indication signal fed back by a TCU corresponding to a last detected thyristor $A_Y$ (1≤Y≤N) is $T_M$ (M≤N).

A time difference: $\Delta T = T_M - T_1$.

When $\Delta T \leq T_{SET1}$, it is considered that sampling and detection at a current time satisfy the consistency requirement, and no recording is needed.

When $\Delta T > T_{SET1}$, it is considered that sampling and detection at a current time do not satisfy the consistency requirement, and statistics of thyristors within a time $T_{SET2}$ after a reference moment $T_1$ and a number $S_1$ of the thyristors and thyristors having a negative bias characteristic within a time $T_{SET2}$ before a reference moment $T_M$ and a number $S_2$ of the thyristors is performed.

When $S_1 \leq S_{SET1}$, it is considered that thyristors within this range have a positive bias characteristic, and accumulation is performed in the corresponding memories, otherwise, no accumulation is needed.

When $S_2 \leq S_{SET1}$, it is considered that thyristors within this range have a negative bias characteristic, and accumulation is performed in the corresponding memories, otherwise, no accumulation is needed.

$T_{SET1}$: Predetermined duration of consistency statistics.
$T_{SET2}$: Predetermined duration of inconsistency bias.
$S_{SET1}$: Number value of inconsistent thyristor levels.

The bias screening in the foregoing method (4) uses the bias statistics method. A method 2 may be used. In the method, the time information of the status indication signals fed back by the TCUs of the converter valve satisfies a normal distribution, an expected deviation parameter and a standard deviation parameter are set so as to determine a normal distribution interval, and the pieces of time information is compared with the normal distribution interval, wherein if the time information of the status indication signals fed back by the TCUs of the converter valve is all comprised in the normal distribution interval range, it can be determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the normal distribution interval are selected and accumulated in memories of respective thyristor levels.

As discussed in the method 2, it is assumed that a number of thyristors included in one converter valve is N (N 1). $A_1$, $A_2$, ..., and $A_N$ represent thyristors on N levels. It is determined, according to a voltage design requirement of a thyristor level and a voltage threshold for a status indication signal fed back by a corresponding TCU, that an expected value of a sampling time in each period of the converter VCU is $T_\mu$ and a standard deviation is K. A time of a status indication signal fed back by a TCU corresponding to a thyristor $A_x$ (1≤X≤N) is $T_x$ (1≤X≤N).

When $|T_x-T_\mu|$≤K, it is considered that sampling and detection at a current time satisfy the consistency requirement, and no recording is needed.

When $|T_x-T_\mu|$>K, it is considered that sampling and detection at a current time do not satisfy the consistency requirement.

When $T_x<T_\mu-K$, it is considered that the thyristor has a positive bias characteristic, and accumulation is performed in the corresponding memory.

When $T_x>T_\mu+K$, it is considered that the thyristor has a negative bias characteristic, and accumulation is performed in the corresponding memory.

The bias screening in the foregoing method (4) uses the bias statistics method. A method 3 may be used. In the method, an average value of the time information of the status indication signals fed back by TCUs of the converter valve is calculated, a time range parameter is preset so as to determine an average distribution interval range with the average value as the center and the time range parameter as positive and negative boundary conditions, and the pieces of time information is compared with the range, wherein if the time information of the status indication signals fed back by the TCUs of the converter valve is all comprised in the average distribution interval range, it can be determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the average distribution interval are selected and accumulated in memories of respective thyristor levels.

As discussed in the method 3, it is assumed that a number of thyristors included in one converter valve is N (N≥1). $A_1$, $A_2$, ..., and $A_N$ represent thyristors on N levels. Time information $T_x$ (1≤X≤N) of status indication signals fed back by TCUs on the N levels is consecutively sampled M times and recorded, so as to calculate an average time $T_Y$(1≤Y≤M) of time information of the status indication signals fed back by TCUs on the N levels in each sampling:

$$T_Y = \frac{\sum_{X=1}^{N} Tx}{N},$$

and thus calculate a time information average value $T_{SET}$ of the average time of the M times:

$$T_{SET} = \frac{\sum_{Y=1}^{M} T_y}{M}.$$

A time range parameter K is determined according to a voltage design requirement of a thyristor level and a voltage threshold for a status indication signal fed back by a corresponding TCU.

A time of a status indication signal fed back by a TCU corresponding to a thyristor $A_Z$ (1≤Z≤N) is $T_z$ (1≤Z≤N).

When $|T_Z-T_{SET}|$≤K, it is considered that sampling and detection at a current time satisfy the consistency requirement, and no recording is needed.

When $|T_Z-T_{set}|$>K, it is considered that sampling and detection at a current time do not satisfy the consistency requirement.

When $T_Z<T_{SET}-K$, it is considered that the thyristor has a positive bias characteristic, and accumulation is performed in the corresponding memory.

When $T_Z>T_{SET}+K$, it is considered that the thyristor has a negative bias characteristic, and accumulation is performed in the corresponding memory.

The predetermined duration in the method 1 of the bias statistics method, the normal distribution interval in the method 2 of the bias statistics method, and the average distribution interval in the method 3 of the bias statistics method all shall be set according to a requirement of a voltage-balancing parameter for a thyristor level, and an over-voltage extremum which a thyristor level can bear on the basis that a voltage-balancing consistency requirement is not satisfied shall be fully considered.

Figure 4:
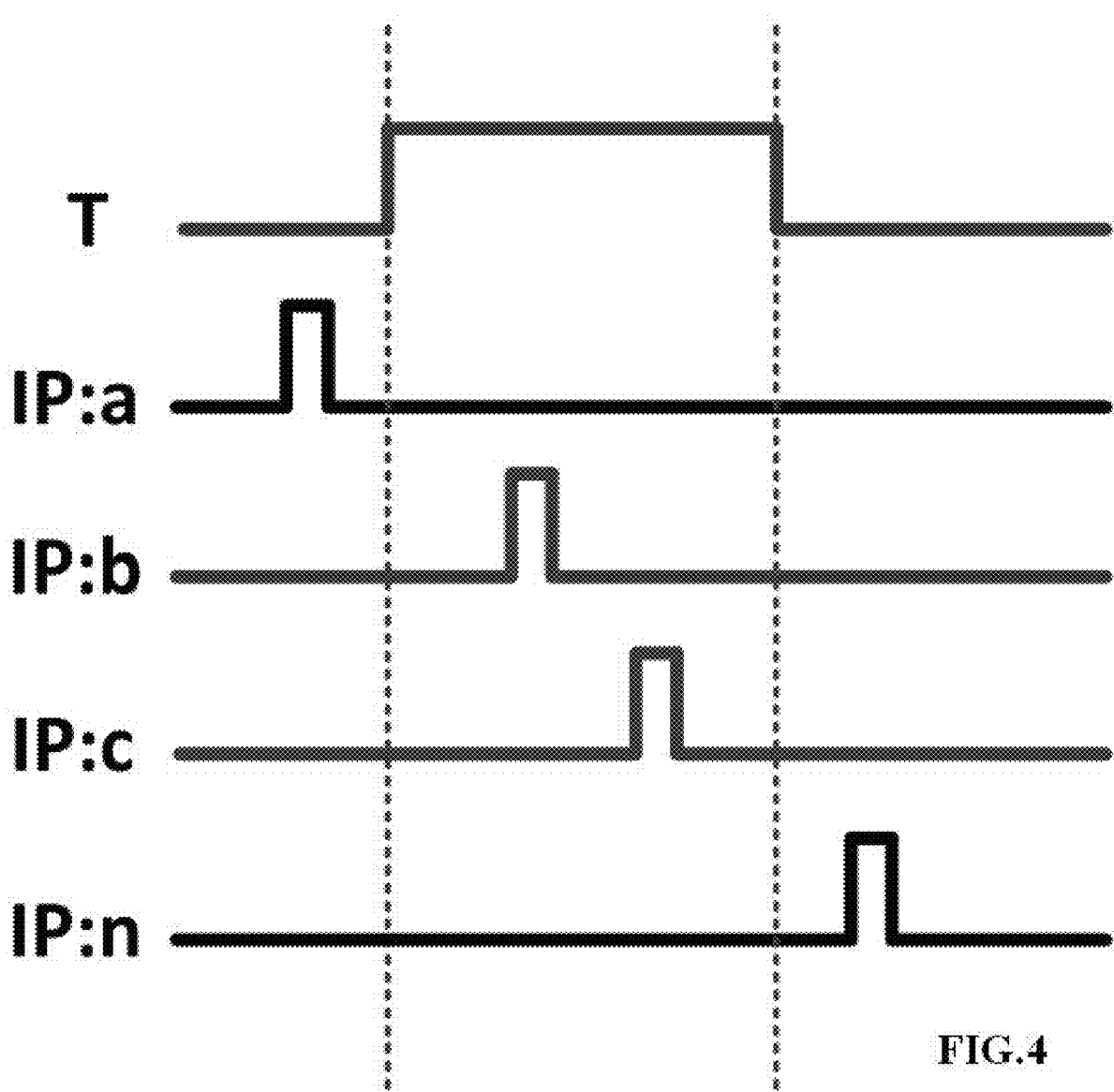
FIG. 4 is a diagram showing a principle of screening for bias data according to the present invention.

FIG. 4 is a diagram showing a principle of screening for bias data. T represents a predetermined time. IP:a, IP:b, IP:c, and IP:n represent status indication signals fed back by different TCUs.

Adding a timestamp to the data in the method (4) means that a time point when data having a relatively large bias occurs is recorded, so as to obtain a statistical distribution of performance biases of thyristor levels with time.

A thyristor level whose accumulated bias number exceeds a set threshold is selected according to the data statistics result, a specific position of the thyristor level in the converter valve is determined, and a probability of a problem in the thyristor level is predicted according to the data statistics result.

(5) An interface for providing and reading bias data is designed in the converter VCU, so as to on-line monitor bias data or read the data for off-line analysis. A standard data bus interface is used for a physical connection of the data interface, and any communication standard or combination based on a format of a standard communication protocol is used for data transmission. Specifically, an Ethernet standard data bus interface may be used for a physical connection. The data transmission uses FTP, IEC61850, IEC60870-5-103, or PROFIBUS.

The data interface in the method (5) may be used for on-line reading or viewing the data in real time or copying the data to a viewing device for off-line viewing.

(6) An accumulated value within a predetermined time range in the memory is read and used as a data statistics result. All data may be used for comparison and analysis of performance differences between thyristor levels on one entire single valve.

(7) Important data such as accumulated values of the positive biases and the negative biases corresponding to the thyristor levels and time information corresponding to the occurrence of a bias may be stored, according to the predetermined duration, in a storage device having a long-time data storage function.

The data stored in the predetermined duration in the method (7) includes bias data information corresponding to all thyristor levels of a single valve. The bias data information includes a set of data having a positive bias characteristic or a negative bias characteristic relative to a specified duration and the time information corresponding to the occurrence of a bias. The thyristor level bias data is an accumulated number in which a status feedback signal of a thyristor on a level has a time bias within the predetermined time range. All data may be used for comparison and analysis of performance differences between thyristor levels on an entire single valve. The time bias may represent a bias of voltage-balancing consistency of the converter valve.

In conclusion, in the early warning method and system for a failure in a converter valve according to the present invention, statistics and comparison of the time of status indication signals fed back by all TCUs of a single valve of a converter valve are performed. Those having a relatively large bias from a predetermined interval range are selected, and are subjected to classification and statistics by a positive bias or a negative bias. A thyristor level whose accumulated bias number exceeds a threshold is selected according to a data statistics result, and a specific position of the thyristor level in the converter valve is determined. In this way, a probability of a problem in such thyristor levels can be predicted, and a reference for device replacement and design optimization is provided.

The above embodiments are merely for illustration of the technical idea of the present invention and are not intended to limit the scope of protection of the present invention, and various modifications made to the technical solution based on the technical idea of the present invention fall within the scope of protection of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An early warning method for a failure in a converter valve, comprising:
   within a predetermined time range, recording time information of status indication signals fed back by thyristor control units (TCUs) of a converter valve;
   performing statistics and comparison of the pieces of time information using a bias statistics method;
   marking a thyristor level whose bias exceeds a preset value; and
   determining a probability of failure in the thyristor according to the marking result;
   wherein the status indication signals fed back by the TCUs represent status indication signals which are acquired by a converter valve control unit (VCU) and are fed back by the respective TCUs corresponding to the thyristor levels of the converter valve, the status indication signal being a status indication signal meaning that a thyristor level has established a forward voltage and meet a trigger condition;
   the TCUs preset a voltage threshold, wherein the setting of the threshold satisfies a minimum energy requirement with which the TCUs can trigger a thyristor to be reliably turned on; and
   if detecting that a voltage across a thyristor exceeds the voltage threshold, the TCUs generate a status indication signal and send the same to the converter VCU.

2. The early warning method for a failure in a converter valve according to claim 1, wherein the bias statistics method involves: finding a time of earliest arrival and a time of latest arrival from the time information of the status indication signals fed back by the TCUs of the converter valve, calculating a time difference between the earliest arrival and the latest arrival, and comparing the time difference with a predetermined duration, wherein
   if the time difference is less than the predetermined duration, it is determined that the status indication signals fed back by the TCUs of the converter valve satisfy a consistency requirement; or
   otherwise, it is considered that the status indication signals do not satisfy the consistency requirement, and status indication signals having a positive bias characteristic or a negative bias characteristic relative to the predetermined duration are selected and accumulated in memories of respective thyristor levels.

3. The early warning method for a failure in a converter valve according to claim 2, the early warning method further comprising: recording a time point when the status indication signals having a positive bias characteristic or a negative bias characteristic occur, so as to obtain a statistical distribution of performance biases of thyristor levels with time.

4. The early warning method for a failure in a converter valve according to claim 2, the early warning method further comprising: reading an accumulated value within the predetermined time range as a data statistics result, wherein all data is used for comparison and analysis of performance differences between the thyristor levels of the converter valve; and
   selecting, according to the data statistics result, a thyristor level whose accumulated bias number exceeds a set threshold, determining a specific position of the thyristor level in the converter valve, and predicting a probability of a problem in the thyristor level according to the data statistics result.

5. The early warning method for a failure in a converter valve according to claim 2, the early warning method further comprising: storing, according to the predetermined duration, accumulated values of the positive biases and the negative biases corresponding to the thyristor levels and time information corresponding to the occurrence of a bias in a storage device having a long-term data storage function.

6. The early warning method for a failure in a converter valve according to claim 1, wherein the bias statistics method involves: if the time information of the status indication signals fed back by the TCUs of the converter valve satisfies a normal distribution, setting an expected deviation parameter and a standard deviation parameter so as to determine a normal distribution interval, and comparing the pieces of time information with the normal distribution interval, wherein
   if the time information of the status indication signals fed back by the TCUs of the converter valve is all comprised in the normal distribution interval range, it is determined that the status indication signals fed back by the TCUs of the converter valve satisfy a consistency requirement; or
   otherwise, it is considered that the status indication signals do not satisfy the consistency requirement, and status indication signals having a positive bias characteristic or a negative bias characteristic relative to the normal distribution interval are selected and accumulated in memories of respective thyristor levels.

7. The early warning method for a failure in a converter valve according to claim 6, the early warning method further comprising: recording a time point when the status indication signals having a positive bias characteristic or a negative bias characteristic occur, so as to obtain a statistical distribution of performance biases of thyristor levels with time.

8. The early warning method for a failure in a converter valve according to claim 6, the early warning method further comprising: reading an accumulated value within the predetermined time range as a data statistics result, wherein all data is used for comparison and analysis of performance differences between the thyristor levels of the converter valve; and selecting, according to the data statistics result, a thyristor level whose accumulated bias number exceeds a set threshold, determining a specific position of the thyristor level in the converter valve, and predicting a probability of a problem in the thyristor level according to the data statistics result.

9. The early warning method for a failure in a converter valve according to claim 6, the early warning method further comprising: storing, according to the predetermined duration, accumulated values of the positive biases and the negative biases corresponding to the thyristor levels and time information corresponding to the occurrence of a bias in a storage device having a long-term data storage function.

10. The early warning method for a failure in a converter valve according to claim 1, wherein the bias statistics method involves: calculating an average value of the time information of the status indication signals fed back by the TCUs of the converter valve, presetting a time range parameter so as to determine an average distribution interval range with the average value as the center and the time range parameter as positive and negative boundary conditions, and comparing the pieces of time information with the interval range, wherein if the time information of the status indication signals fed back by the TCUs of the converter valve is all comprised in the average distribution interval range, it is determined that the status indication signals fed back by the TCUs of the converter valve satisfy a consistency requirement; or otherwise, it is considered that the status indication signals do not satisfy the consistency requirement, and status indication signals having a positive bias characteristic or a negative bias characteristic relative to the average distribution interval are selected and accumulated in memories of respective thyristor levels.

11. The early warning method for a failure in a converter valve according to claim 10, the early warning method further comprising: recording a time point when the status indication signals having a positive bias characteristic or a negative bias characteristic occur, so as to obtain a statistical distribution of performance biases of thyristor levels with time.

12. The early warning method for a failure in a converter valve according to claim 10, the early warning method further comprising: reading an accumulated value within the predetermined time range as a data statistics result, wherein all data is used for comparison and analysis of performance differences between the thyristor levels of the converter valve; and selecting, according to the data statistics result, a thyristor level whose accumulated bias number exceeds a set threshold, determining a specific position of the thyristor level in the converter valve, and predicting a probability of a problem in the thyristor level according to the data statistics result.

13. The early warning method for a failure in a converter valve according to claim 10, the early warning method further comprising: storing, according to the predetermined duration, accumulated values of the positive biases and the negative biases corresponding to the thyristor levels and time information corresponding to the occurrence of a bias in a storage device having a long-term data storage function.

* * * * *